United States Patent
Billing et al.

(10) Patent No.: US 8,412,987 B2
(45) Date of Patent: *Apr. 2, 2013

(54) NON-VOLATILE MEMORY TO STORE MEMORY REMAP INFORMATION

(75) Inventors: Gurkirat Billing, Lincoln, CA (US);
Stephen Bowers, Woodland, CA (US);
Mark Leinwander, Folsom, CA (US);
Samuel David Post, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 40 days.

This patent is subject to a terminal disclaimer.

(21) Appl. No.: 12/494,994

(22) Filed: Jun. 30, 2009

(65) Prior Publication Data
US 2010/0332895 A1  Dec. 30, 2010

(51) Int. Cl.
*G11C 29/44* (2006.01)
*G11C 29/50* (2006.01)

(52) U.S. Cl. .................................. 714/723; 714/710

(58) Field of Classification Search .................. None
See application file for complete search history.

(56) References Cited

U.S. PATENT DOCUMENTS

| | | | |
|---|---|---|---|
| 4,335,459 A | 6/1982 | Miller | |
| 5,363,484 A | 11/1994 | Desnoyers et al. | |
| 5,418,796 A | 5/1995 | Price et al. | |
| 5,434,868 A | 7/1995 | Aichelmann, Jr. et al. | |
| 5,465,262 A | 11/1995 | Dell et al. | |
| 5,530,673 A | 6/1996 | Tobita et al. | |
| 5,764,878 A | 6/1998 | Kablanian et al. | |
| 5,867,642 A | 2/1999 | Vivio et al. | |
| 5,974,564 A * | 10/1999 | Jeddeloh ............................ 714/8 |
| 6,006,306 A * | 12/1999 | Haywood et al. ............. 711/108 |
| 6,067,262 A | 5/2000 | Irrinki et al. | |
| 6,236,602 B1 * | 5/2001 | Patti ................................ 365/201 |
| 6,339,546 B1 | 1/2002 | Katayama et al. | |
| 6,467,048 B1 | 10/2002 | Olarig et al. | |
| 6,525,966 B1 * | 2/2003 | Hollmer et al. ............. 365/185.2 |
| 6,539,506 B1 | 3/2003 | Lammers et al. | |
| 6,651,202 B1 | 11/2003 | Phan | |
| 6,848,070 B1 | 1/2005 | Kumar | |
| 6,941,505 B2 | 9/2005 | Yada et al. | |
| 7,043,672 B2 | 5/2006 | Merritt | |
| 7,233,054 B1 | 6/2007 | Anh et al. | |
| 7,346,815 B2 | 3/2008 | Nowicki | |
| 7,373,562 B2 | 5/2008 | Poechmueller | |
| 7,434,122 B2 | 10/2008 | Jo | |
| 7,467,337 B2 | 12/2008 | Nakamura et al. | |
| 7,519,875 B2 | 4/2009 | Rearick et al. | |
| 7,644,323 B2 | 1/2010 | Wu et al. | |
| 7,661,004 B2 | 2/2010 | May et al. | |
| 7,757,135 B2 | 7/2010 | Nadeau-Dostie et al. | |
| 7,858,960 B2 | 12/2010 | Chang | |

(Continued)

OTHER PUBLICATIONS

Patent Application filed Jun. 30, 2009 in co-pending U.S. Appl. No. 12/494,830, 34 pages.

(Continued)

*Primary Examiner* — Ajay Bhatia
*Assistant Examiner* — Dipakkumar Gandhi
(74) *Attorney, Agent, or Firm* — Knobbe, Martens, Olson & Bear LLP

(57) ABSTRACT

A memory device may comprise a port to receive remap information regarding a memory device and may comprise a content-addressable memory (CAM) to store the remap information, wherein the CAM may comprise a nonvolatile, discretely-addressable memory.

21 Claims, 9 Drawing Sheets

U.S. PATENT DOCUMENTS

| | | |
|---|---|---|
| 7,908,530 B2 | 3/2011 | Chen |
| 2001/0004326 A1* | 6/2001 | Terasaki .................. 365/185.23 |
| 2004/0024961 A1* | 2/2004 | Cochran et al. ............... 711/112 |
| 2005/0120265 A1 | 6/2005 | Pline et al. |
| 2006/0156192 A1 | 7/2006 | Nakamura et al. |
| 2007/0006048 A1 | 1/2007 | Zimmer et al. |
| 2007/0038906 A1 | 2/2007 | Lakhani et al. |
| 2008/0010435 A1 | 1/2008 | Smith et al. |
| 2008/0049514 A1* | 2/2008 | Mondello et al. ......... 365/185.22 |
| 2009/0063914 A1* | 3/2009 | Owsley et al. ................ 714/718 |
| 2009/0132876 A1 | 5/2009 | Freking et al. |
| 2009/0287956 A1 | 11/2009 | Flynn et al. |
| 2010/0037005 A1* | 2/2010 | Kim et al. ..................... 711/103 |
| 2010/0107004 A1 | 4/2010 | Bottelli et al. |

OTHER PUBLICATIONS

Patent Application filed Jun. 30, 2009 in co-pending U.S. Appl. No. 12/495,032, 41 pages.

Patent Application filed Jun. 30, 2009 in co-pending U.S. Appl. No. 12/494,904, 31 pages.

Patent Application filed Jun. 30, 2009 in co-pending U.S. Appl. No. 12/495,081, 31 pages.

Patent Application filed Jun. 30, 2009 in co-pending U.S. Appl. No. 12/494,950, 36 pages.

* cited by examiner

700

| Received address | Remapped | Remapped address |
|---|---|---|
| addr1 | yes | addr1' |
| addr2 | no | - |
| addr3 | no | - |
| addr4 | no | - |
| addr5 | yes | addr5' |
| addr6 | no | - |
| addr7 | yes | addr7' |
| addr8 | yes | addr8' |
| ⋮ | ⋮ | ⋮ |

FIG. 7

NON-VOLATILE MEMORY TO STORE MEMORY REMAP INFORMATION

BACKGROUND

1. Field

Subject matter disclosed herein relates to remapping memory devices.

2. Information

Memory devices are employed in many types of electronic devices, such as computers, cell phones, PDA'S, data loggers, and navigational equipment, just to name a few examples. Among such electronic devices, various types of nonvolatile memory devices may be employed, such as NAND or NOR flash memories, SRAM, DRAM, and phase-change memory, just to name a few examples. In general, writing or programming processes may be used to store information in such memory devices, while a read process may be used to retrieve stored information.

Such nonvolatile memory devices may comprise memory cells that slowly deteriorate over time, leading to an increasing probability that a read and/or write error may occur upon accessing such a memory cell. Errors may also result from manufacture defects and/or marginal memory device construction, just to name a few examples. Though such errors may be subsequently corrected within a memory device, for example, such error correction may become difficult or impossible as the number of errors increases.

BRIEF DESCRIPTION OF THE FIGURES

Non-limiting and non-exhaustive embodiments will be described with reference to the following figures, wherein like reference numerals refer to like parts throughout the various figures unless otherwise specified.

FIG. 7 is a schematic view of a vector remap table, according to an embodiment.

DETAILED DESCRIPTION

Figure 1:
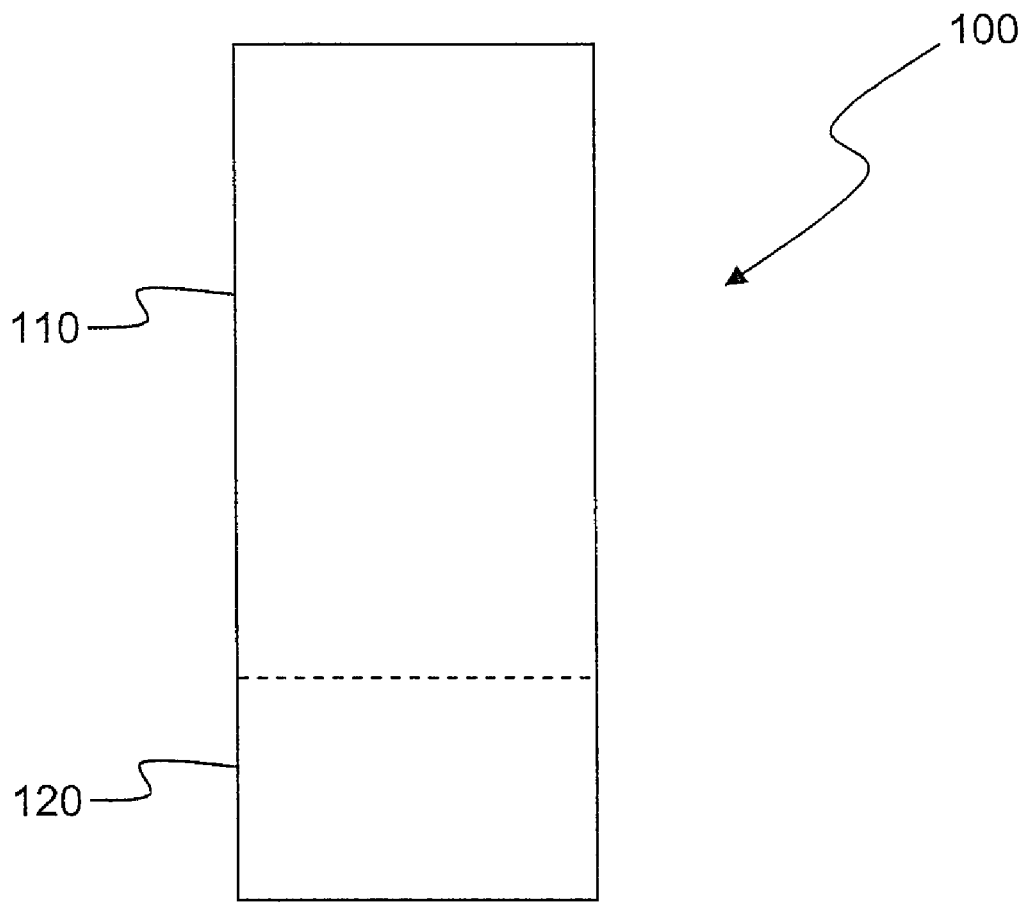
FIG. 1 is a schematic view of a memory configuration, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, remap information regarding a memory device may be maintained in a nonvolatile, discretely-addressable memory. Such remap information may comprise remap vectors that provide a remap address to substitute for an address provided by a processor, for example, as part of a read/write request directed to the memory device. Here, a discretely-addressable memory may comprise memory cells, for example, that need not be written in blocks and/or sectors at a time, but may be individually addressed or addressed in relatively small groups. For example, writing data to a NOR flash-type memory may involve writing to a large block of memory cells, even if the data to be written only requires a memory space of one or two memory cells. In another example, writing data, such as remap information, to a phase-change memory (PCM) may involve writing merely to a number of memory cells that substantially match the memory size of the data to be written.

Maintaining remap information in such a nonvolatile, discretely-addressable memory may provide finer-grained control of particular areas of memory to be remapped. For example, such a nonvolatile, discretely-addressable memory may allow discrete addressing to store remap vectors in relatively small portions of a memory space. In contrast, a non discretely-addressable memory may utilize block and/or sector addressing so that storing merely a single remap vector, for example, may occupy a relatively large portion of the memory device. Additionally, a memory utilizing block and/or sector addressing may involve an erase process to prepare a memory block and/or sector for a subsequent write process, resulting in an increased amount of write-time compared to a discretely-addressable memory. Accordingly, storing and maintaining remap information in a nonvolatile, discretely-addressable memory may provide a way to improve memory space utilization of the memory device as well as decrease the amount of time involved in a write process. In one implementation, maintaining remap information in a nonvolatile, discretely-addressable memory may allow use of a volatile memory device to which such remap information pertains, since such a non-volatile memory may store such remap information even during a power-down. Accordingly, storing and maintaining remap information in a nonvolatile, discretely-addressable memory may allow an increased flexibility in choosing memory type, such as NAND or NOR flash memories, SRAM, DRAM, and PCM, just to name a few examples.

In one implementation, a memory device to which remap information pertains may physically comprise a nonvolatile, discretely-addressable memory such that a single die or integrated circuit chip comprises both a memory device and nonvolatile, discretely-addressable memory. In such an implementation, however, a memory device may be distinct from a nonvolatile, discretely-addressable memory so that such a memory device and nonvolatile, discretely-addressable memory may be separately accessed through a processor and/or memory controller. For example, a nonvolatile, discretely-addressable memory used to store remap information regarding a memory device may reside on the memory device but still be distinct from such a memory device. Continuing the example, such a memory device may comprise a memory module that includes multiple memory die: while the memory die may be accessed via a single processor and/or memory controller, a nonvolatile, discretely-addressable memory used to store remap information may be accessed through a separate processor and/or memory controller. Of course, such details and advantages of maintaining remap information on a nonvolatile, discretely-addressable memory are merely examples, and claimed subject matter is not so limited.

Storing and maintaining remap information regarding a memory device on a nonvolatile, discretely-addressable memory may also result in reduced latency and/or increased use of available memory capacity compared to maintaining remap information within the memory device, for example. In one implementation, such remap information may be generated on-the-fly, for example, during run-time processes such as read/write processes initiated by a processor, wherein data read from a memory device is checked for errors, as described below. In another implementation, an initialization process may be performed by a system to include scanning for error-prone portions of a memory device. Again, such details and advantages of maintaining remap information in a nonvolatile, discretely-addressable memory are merely examples, and claimed subject matter is not so limited.

In an embodiment, a memory device may comprise memory cells that slowly deteriorate over time, which may lead to an increased probability that one or more errors may occur while reading such a memory device. A memory device may also comprise defective and/or marginally functional memory cells as a result of their manufacture. Such errors may be corrected in several areas within a computing system, for example, using error correction codes (ECC) or other such techniques. From a system perspective, a determination may be made as to whether or not to continue to utilize such error-prone cells. As will be explained in further detail below, such a determination may be based, at least in part, on a comparison of the number of such errors to an error threshold, which may be defined during a design stage of a memory device, for example. In one implementation, use of particular memory cells may be discontinued before such cells display an excess number of errors. In other words, use of error-prone memory cells may be discontinued if such memory cells produce a number of errors that approaches an error threshold. Such a threshold need not be reached, for example, in order to determine that use of memory cells may be discontinued. Accordingly, observing a number of errors approaching an error threshold may be a way to predict that particular memory cells may soon produce too many errors, so use of such error-prone memory cells may be stopped before the memory cells actually begin to critically malfunction, for example. If use of particular memory cells is to be discontinued, then replacement memory cells may be selected in a manner that maintains an overall memory device capacity.

Accordingly, in one embodiment, a process to maintain a size capacity of a memory device may include remapping an error-prone memory location to a properly functioning memory location, without a loss of overall system memory space (e.g., storage device capacity). Such remapping may be based, at least in part, on information regarding a quantity and/or frequency of errors occurring as a result of reading from an error-prone memory location. Here, memory location refers to a portion of a memory device that may be accessed, e.g., via a read and/or write process, using an address or addresses to identify such a memory location and/or portion. As explained in farther detail below, an ECC engine, for example, may be used to determine a bit error rate and/or the number of bit errors associated with reading a particular portion of a memory. Subsequently, the bit error rate and/or number of bit errors may be compared to an error threshold, which may comprise a substantial limit to an acceptable number of errors, for example. Depending on an outcome of such a comparison, a decision may be made regarding whether to retire, e.g., discontinue use of, the particular portion of memory producing the errors.

In a particular embodiment, a process of retiring a portion of a memory device may include moving digital signals representative of data stored in the to-be-retired portion of the memory device to another portion of the memory device. In one implementation, such digital signals representing data relocated from a retired portion of a memory device may be moved to a spare portion of the memory device. For example, such a spare portion of memory may include a physical location of the memory device not initially recognized or considered as part of the full capacity of the memory device, as explained in more detail below. A process of retiring a portion of a memory device may also include remapping an address of a to-be-retired portion of the memory device to correspond to an address of a new, spare portion of the memory device. Such remapped addresses may be stored in a nonvolatile, discretely-addressable memory, for example, as indicated above. Of course, such processes are merely examples, and claimed subject matter is not so limited.

In one embodiment, a process such as that described above may involve a memory device comprising a device. Accordingly, as a PCM ages, a bit error rate and/or a number of bit errors produced by portions of the PCM may increase. Such errors, to some extent, may be corrected using an ECC engine and/or other such error correcting techniques, for example. However, a number of errors may increase beyond a capability of such error-correcting techniques. Therefore, it may be desirable to retire such memory portions upon an indication of a trend that such memory portions have been or are beginning to produce an excessive number of errors.

Embodiments, such as those described above, may allow successful use of storage devices involving relatively less reliable technologies. For example, a die previously considered unusable may be employed using embodiments described herein. Also, such embodiments may extend a lifetime of a storage device to that of a majority of its memory cells rather than the life of a relatively few of its memory cells.

FIG. 1 is a schematic view of a memory configuration, according to an embodiment. A memory device 100 may be partitioned into a main memory 110 and a spare memory 120. Memory device 100 may comprise NAND or NOR flash memories, SRAM, DRAM, or PCM, just to name a few examples. Memory device 100 may comprise a user-addressable memory space including such main and spare memory portions and/or one or more other memory portions, which may or may not be contiguous with one another, and may or may not reside on a single device. Main memory 110 and spare memory 120 may comprise independent addressable spaces that may be accessed by read, write, and/or erase processes, for example.

According to an embodiment, one or more portions of memory device 100 may store signals representative of data and/or information as expressed by a particular state of memory device 100. For example, an electronic signal representative of data and/or information may be "stored" in a portion of memory device by affecting or changing the state of such portions of memory device 100 to represent data and/or information as binary information (e.g., ones and zeros). As such, in a particular implementation, such a change of state of the portion of memory to store a signal representative of data and/or information constitutes a transformation of memory device 100 to a different state or thing.

Memory device 100 may be configured to initially comprise main memory 110 corresponding to the fully usable capacity of memory device 100. Such an initial configuration may additionally comprise spare memory 120 that need not be included in determining memory device capacity. However, if portions of main memory become unusable or result in an excess number of errors during read/write processes, for example, spare memory 120 may be used to replace portions of main memory 110. Of course, details of such a memory configuration are merely examples, and claimed subject matter is not so limited.

Figure 2:
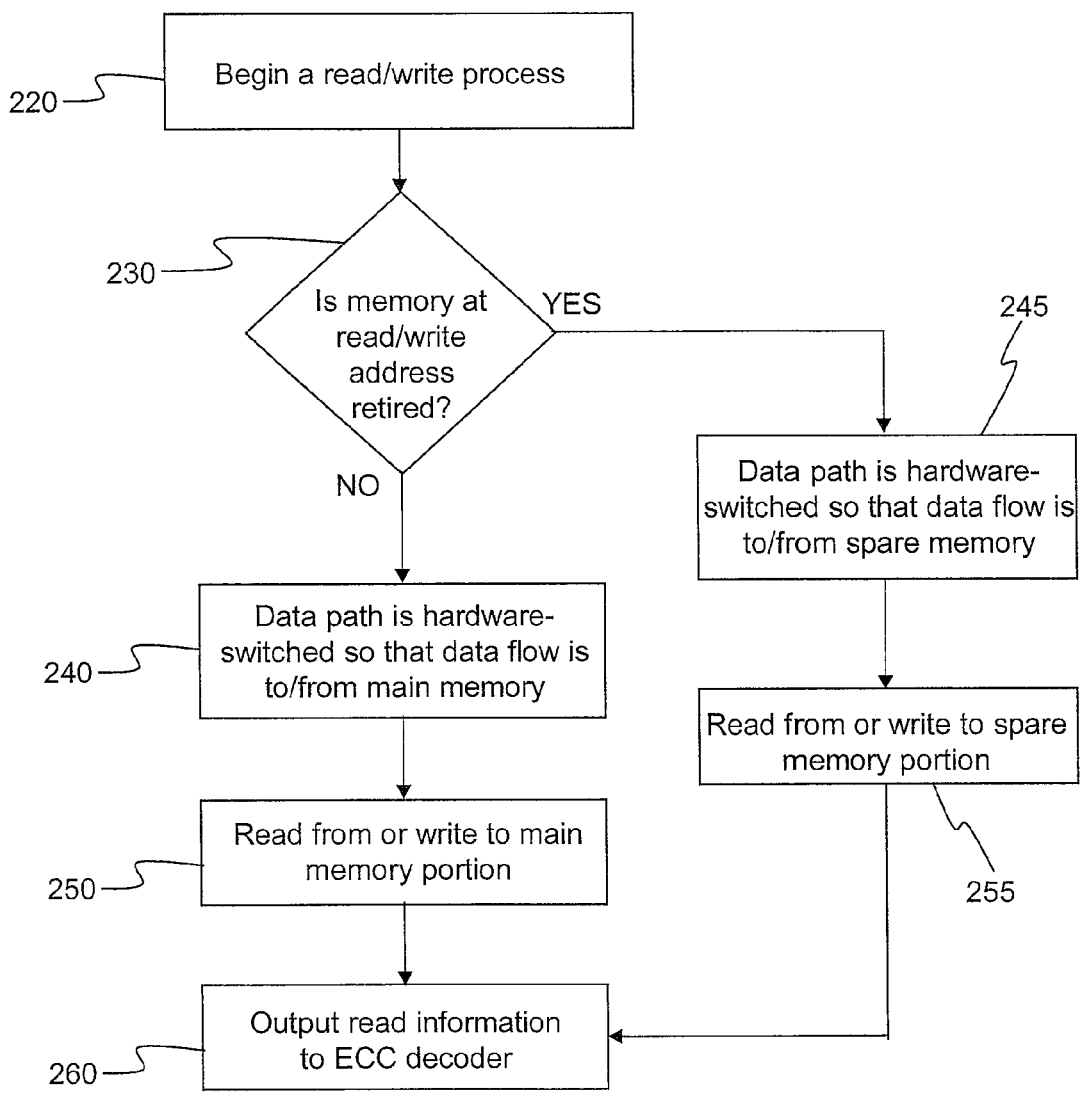
FIG. 2 is a flow diagram of a memory read process, according to an embodiment.

FIG. 2 is a flow diagram of a memory read/write process 200, according to an embodiment. At block 220, a read/write process to read or write to a portion of a memory device may be initiated, for example, by a system application executed by a processor (not shown) providing one or more read/write addresses to respectively identify one or more memory locations from where stored data is to be read or written to. Beginning at block 230, such a read/write address may direct a data read/write process along a data path previously selected based, at least in part, on whether the read/write address corresponds to a memory location that has been retired. In the present example, a memory device may comprise a main memory portion and a spare memory portion, such as memory device 100 shown in FIG. 1, for example. In a particular implementation, a spare memory portion may be used in place of a main memory portion that is retired. In a case where such a memory location has not been retired, at block 240, the data path may direct a data read/write process to a location in a main memory portion corresponding to an address transmitted by a processor. Such directing may be performed by an appropriately switched hardware switching component, such as a multiplexer, for example. For example, a signal may be applied to a hardware switching component to select a data path that leads to a main memory portion corresponding to an address transmitted by the processor. Other data paths selected by the hardware switching component may comprise individual data paths leading to different portions of a memory device, such as a spare memory portion, for example.

As a result, at block 250, the read/write address transmitted by the processor may be used to read from or write to the main memory portion of the memory device. Subsequently, at block 260, data read from the read address of the memory device may be provided to error-checking hardware and/or software, such as an ECC decoder and/or other such error correcting techniques, for example. In the case of writing data to the memory device, a subsequent read process to verify a successful write operation may be performed: such read data may then be provided to error-checking hardware and/or software, such as an ECC decoder and/or other such error correcting techniques, for example.

In a case where a memory location has been retired, at block 245, a data path may direct a data read/write process to a location in a spare memory portion instead of a memory location corresponding to an address transmitted by a processor. Such path directing may be performed by an appropriately switched hardware switching component, such as a multiplexer, for example. In particular, a signal may be applied to such a hardware switching component to select a data path that leads to a spare memory portion corresponding to an address transmitted by a processor. Other data paths selected by the hardware switching component may comprise individual data paths leading to different portions of a memory device, such as a main memory portion and/or other spare memory portions, for example.

As a result, at block 255, the read/write address transmitted by the processor, though originally directed to an address of a main memory portion, may be redirected to a spare memory portion of the memory device. Subsequently, at block 260, data read from or written to the spare memory portion may be provided to error-checking hardware and/or software, such as an ECC decoder and/or other such error correcting techniques, for example. In the case of writing data to the memory device, a subsequent read process to verify a successful write operation may be performed: such read data may then be provided to error-checking hardware and/or software, such as an ECC decoder and/or other such error correcting techniques, for example. Of course, details of such a memory read process are merely examples, and claimed subject matter is not so limited.

Figure 3:
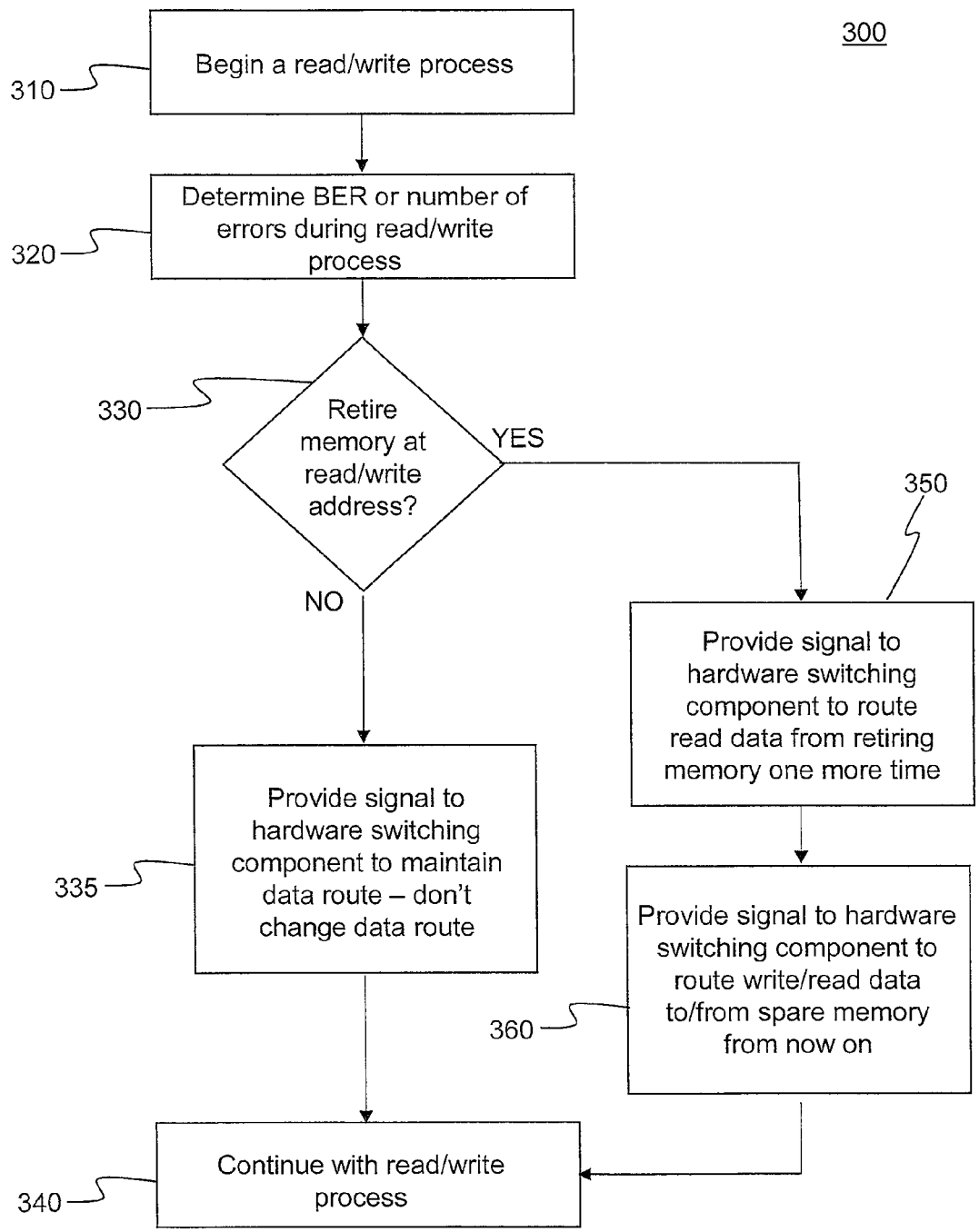
FIG. 3 is a flow diagram of a memory read process, according to another embodiment.

FIG. 3 is a flow diagram of a memory read/write process 300, according to an embodiment. At block 310, a read/write process to read or write to a portion of a memory device may be initiated, for example, by a system application that provides one or more read/write addresses to respectively identify one or more memory locations where stored data is to be read from or written to. ECC hardware and/or software, by parity checking read data for example, may be used to check and/or correct errors in read data. Subsequently, initially read data may be compared to corrected read data to determine the number of errors that occurred in the memory read/write process, as at block 320. Such a number of errors may be expressed as a bit error rate (BER), which may comprise a ratio of the number of error bits to the total number of read bits, for example. A BER or number of errors resulting from reading from a portion of a memory device may be compared to an error threshold value, which may comprise a value that represents a maximum acceptable BER or maximum acceptable number of errors, beyond which, for example, additional errors may not be successfully corrected: such an error threshold value may comprise a number that represents a substantially upper limit of a BER or a number of errors that are correctable for a particular memory device, such as memory device 100 shown in FIG. 1, for example. At or below such an error threshold value, ECC hardware and/or software may be capable of correcting read errors. But above such an error threshold, there may be a relatively high probability that all read errors may not be correctable.

At block 330, a decision is made regarding whether to retire a portion of memory based at least in part on whether reading from such a portion of memory results in too many errors. If such a number of errors is at or below an error threshold, then a decision may be made to not retire such a portion of memory, and read/write process 300 may proceed to block 335. Here, a signal may be provided to hardware switching component so that a route or path on which data is transmitted for the read/write process may be directed to an original main memory portion. Next, at block 340, for example, read data may be provided to an application that requested the read data or write data may be written into an original main memory portion.

On the other hand, if such a number of errors is above an error threshold, then a decision may be made to retire a portion of memory, and read/write process 300 may proceed to block 350 where, for example, a process may begin to retire such a portion of memory that leads to too many errors. In a particular implementation, data stored in such a to-be-retired memory portion may be read one more time by providing a signal to a hardware switching component so that a data route used for the read/write process may be directed to original main memory portion. Next, at block 360, a signal may be provided to hardware switching component so that a data route used for subsequent read and/or write processes may be directed to a spare memory portion used to replace the original main memory portion. Next, at block 340, for example, read data may be provided to an application that requested the read data or write data may be written into a spare memory portion. Of course, details of such a memory read process are merely examples, and claimed subject matter is not so limited.

Figure 4:
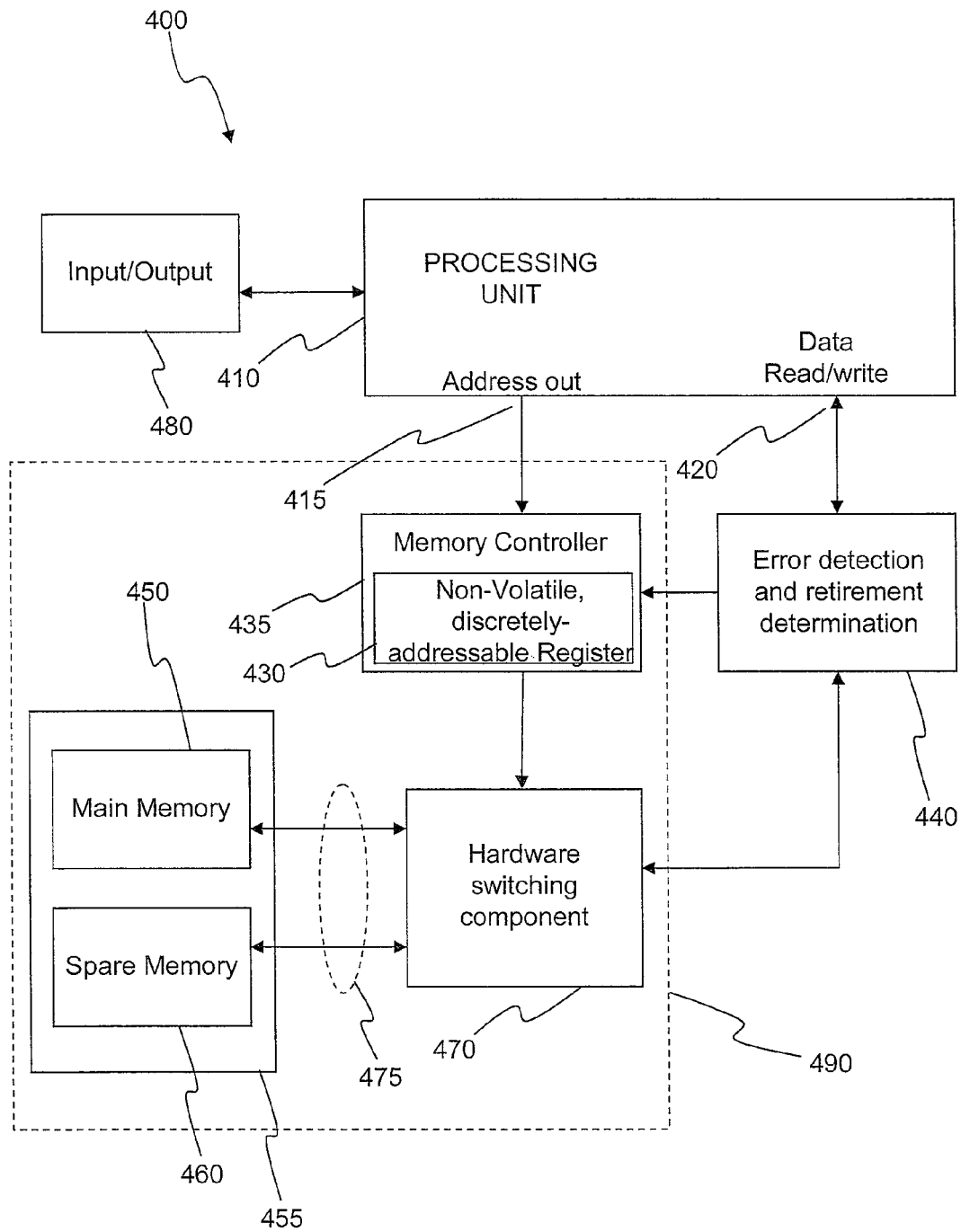
FIG. 4 is a schematic block diagram of a computing system and a memory device, according to an embodiment.

FIG. 4 is a schematic diagram illustrating an embodiment of a computing system 400 including a memory device 455, which may be partitioned into main portion 450 and a spare portion 460 as discussed above regarding FIG. 1, for example. A computing system 400 may be representative of any device, appliance, and/or machine that may be configurable to manage memory device 455. By way of example but not limitation, computing system 400 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in computing system 400, and the processes and methods as further described herein, may be implemented using or otherwise including hardware, firmware, software, or any combination thereof. Thus, by way of example but not limitation, computing system 400 may include at least one processing unit 410 that is operatively coupled to memory 455 through a hardware switching component 470, a memory controller 435, and an error detection and memory retirement determination component 440 (hereinafter named "error detection component" for convenience). Processing unit 410 may be representative of one or more circuits configurable to perform at least a portion of a data computing procedure or process. By way of example but not limitation, processing unit 410 may include one or more processors, controllers, microprocessors, microcontrollers, application specific integrated circuits, digital signal processors, programmable logic devices, field programmable gate arrays, and the like, or any combination thereof. Processing unit 410 may communicate with memory controller 435 to process memory-related operations, such as read, write, and/or erase, for example. Processing unit 410 may include an operating system configured to communicate with memory controller 435. Such an operating system may, for example, generate commands to be sent to memory controller 435 via address output port 415 and/or data read/write port 420. Such commands may include a memory address corresponding to memory 455, for example.

Computing system 400 may include, for example, an input/output portion 480, which may represent one or more devices or features configurable to accept or otherwise introduce human and/or machine inputs, and/or one or more devices or features configurable to deliver or otherwise provide for human and/or machine outputs. By way of example but not limitation, input/output portion 480 may include an operatively configured display, speaker, keyboard, mouse, trackball, touch screen, data port, etc.

Memory controller 435 may include a nonvolatile, discretely-addressable memory 430 to maintain information to be used to select, via hardware switching component 470, among multiple data paths 475 leading to various portions of memory 455. In one embodiment, a discretely-addressable memory may comprise PCM. For example, such information may comprise a table of memory addresses associated with particular memory selection values to select particular data paths 475; if processing unit 410 presents an address as part of a read/write operation, nonvolatile, discretely-addressable memory 430 may be used to associate the address with a particular memory selection value to select a particular data path to memory. Here, for example, a selection may be made to choose a data path to either main memory 450 or spare memory 460. Such a selection, as indicated above, may be based, at least in part, on whether a location of memory 455 associated with an address presented in a read/write process has been retired. To illustrate by a particular example, processing unit 410 may present an address as part of a read operation. The address, received by memory controller 435, may then be associated with a particular memory selection value maintained in nonvolatile, discretely-addressable memory 430. As explained below, such a memory selection value may have been established based, at least in part, on information provided by error detection component 440. Such a memory selection value may then be provided to hardware switching component 470 to select one data path to memory among multiple data paths 475. In the present particular example, the address corresponds to a location of memory 455 previously retired. Accordingly, register 430 may associate the address with a memory selection value that, if presented to hardware switching component 470, may select a data path leading to a location in spare memory 460. Although two data paths are shown to represent multiple data paths 475 in FIG. 4, it should be noted that any number of data paths may be possible. Also, hardware switching component 470 need not be limited to selecting one data path at a time. Similarly, combinations including any number of data paths to any portion of memory 455 are possible, wherein memory 455 may comprise one or more memory devices packaged together or individually, for example. Memory 455 may be representative of any data storage mechanism. Memory 455 may include, for example, a disk drive, an optical disc drive, a tape drive, a solid state memory drive, etc. Accordingly, configurations described herein are merely examples, and claimed subject matter is not so limited.

As indicated above, nonvolatile, discretely-addressable memory 430, such as PCM, may establish and maintain information based, at least in part, on information provided by error detection component 440. In one embodiment, data read from memory 455 may be provided to error detection component 440, which may check for errors to determine a bit error rate and/or the number of bit errors associated with reading a particular portion of memory 455. Such error information may then be provided to memory controller 435, which may compare the bit error rate and/or number of bit errors to an error threshold, for example. Depending on an outcome of such a comparison, a decision may be made regarding whether to retire the particular portion of memory. Accordingly, the address of the particular portion of memory may be associated with a memory selection value that, if presented to hardware switching component 470, may be used to select a data path to an appropriate portion of memory. As described above, nonvolatile, discretely-addressable memory 430 may maintain such memory selection values associated with particular memory addresses.

As shown in FIG. 4, computing system 400 may comprise a hardware portion 490 that includes, for example, memory controller 435, nonvolatile, discretely-addressable memory 430, hardware switching component 470, and/or memory 455. In a particular embodiment, retiring a portion of a memory device and/or determining whether to read/write to/from main or spare memory may comprise a process that is transparent with respect to processing unit 410, which may issue read/write instructions. Accordingly, processor unit 410 need not receive nor process data read from a particular portion of memory that produces errors. Instead, such errors may be intercepted and detected by error detection component 440, which may then provide error information to memory controller 435, as described above. Subsequently, memory controller 435 may determine whether a particular portion of memory 455 should be retired, wherein such a determination may be made within hardware portion 490 and without participation of processing unit 410, for example. In addition, memory controller 435 may determine whether to read/write to/from main or spare memory depending, at least in part, on signals representative of information stored in nonvolatile, discretely-addressable memory 430. Again, such a determination may be made within hardware portion 490 and without participation of processing unit 410. Accordingly, as indicated above, a processor need not be burdened with software processes to reorganize and/or work with memory maps while processing read/write instructions, for example. Of course, such processes are merely examples, and claimed subject matter is not so limited.

Figure 5:
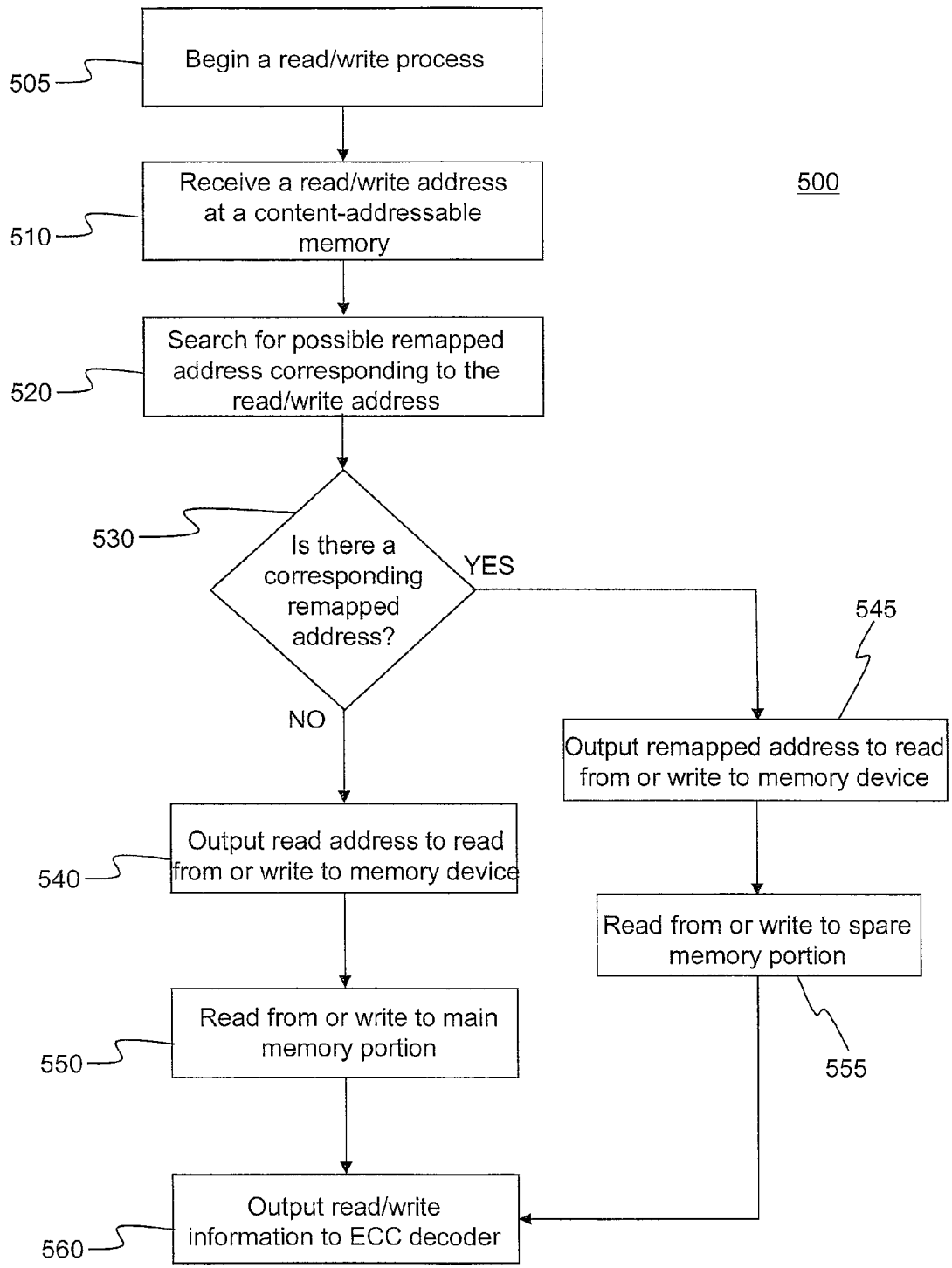
FIG. 5 is a flow diagram of a memory read process, according to an embodiment.

FIG. 5 is a flow diagram of a memory read/write process 500, according to an embodiment. At block 505, a read/write process to read from or write to a portion of a memory device may be initiated, for example, by a system application that provides one or more read/write addresses to respectively identify one or more memory locations where stored data is to be read from or written to. At block 510, one or more such read/write addresses may be provided to a content addressable memory (CAM), for example, where a search may be conducted for possible remapped addresses corresponding to the provided read/write addresses. In one implementation, a CAM may comprise a nonvolatile, discretely-addressable memory such as a PCM. Such a CAM may store digital signals representing a database and/or table that associates original addresses with corresponding remapped addresses. Accordingly, by searching such a CAM, a determination may be made, at block 530, whether an incoming original read/write address is associated with a corresponding remapped address stored in the CAM. If not, wherein a search for a remapped address associated with a particular original read/write address returned a null result, then read/write process 500 may proceed to block 540, where the original read/write address may be output. As a result, at block 550, the original read/write address may be used to read from or write to a memory device. Subsequently, at block 560, data read from or written to the original read/write address of the memory device may be provided to error-checking hardware and/or software, such as an ECC decoder and/or other such error correcting techniques, for example.

On the other hand, if a determination is made, at block 530, that an incoming original read/write address has a corresponding remapped address, then read/write process 500 may proceed to block 545, where a remapped address corresponding to a particular original read/write address may be transmitted. As a result, at block 555, the remapped read/write address may be used to read from or write to a memory device. In one implementation, a spare portion of the memory device may be read or written to if a remapped address is utilized, but such a limitation is merely an example. Subsequently, at block 560, data read from or written to the remapped read/write address of the memory device may be provided to error-checking hardware and/or software, such as an ECC decoder and/or other such error correcting techniques, for example. Of course, details of such a memory read/write process are merely examples, and claimed subject matter is not so limited.

Figure 6:
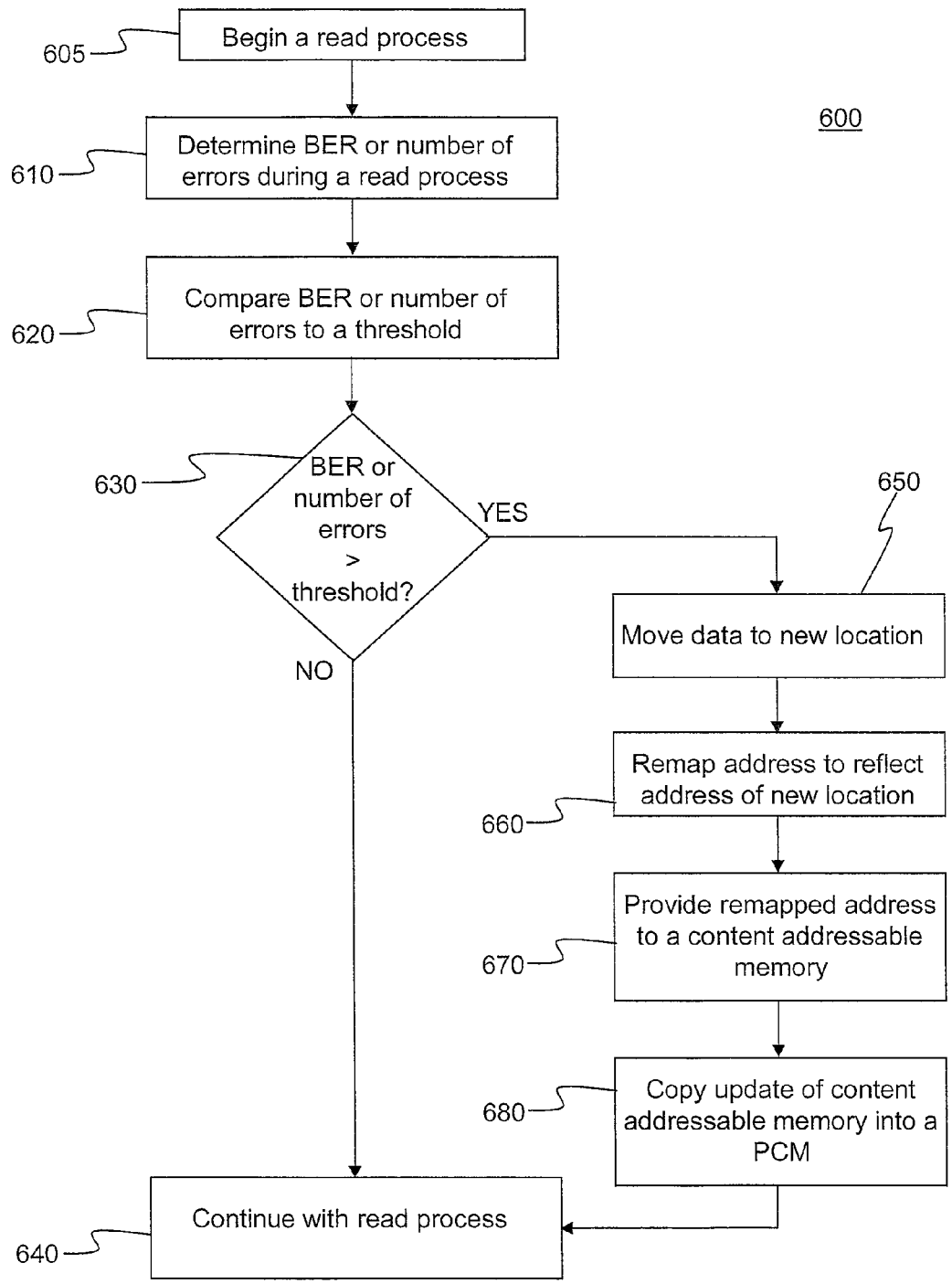
FIG. 6 is a flow diagram of a memory read process, according to another embodiment.

FIG. 6 is a flow diagram of a memory read process 600, according to an embodiment. At block 605, a read process to read signals representative of information stored in a portion of a memory device may be initiated, for example, by a system application that provides one or more read addresses to respectively identify one or more memory locations from where stored signals representative of data is to be read. ECC hardware and/or software, by parity checking read data for example, may be used to check and/or correct errors in read data. Subsequently, initially read data may be compared to corrected read data, thus determining the number of errors that occurred in the memory read process, as at block 610. Such a number of errors may be expressed as a bit error rate (BER), which may comprise a ratio of the number of error bits to the total number of read bits, for example. At block 620, a BER or number of errors resulting from reading from a portion of a memory device may be compared to an error threshold value, which may comprise a value that represents a maximum acceptable BER or maximum acceptable number of errors, beyond which, for example, additional errors may not be successfully corrected: such an error threshold value may comprise a number that represents a substantially upper limit of a BER or a number of errors that are acceptable for a particular memory device, such as memory device 100 shown in FIG. 1, for example. At or below such an error threshold value, ECC hardware and/or software may be capable of correcting read errors. But above such an error threshold, there may be a relatively high probability that at least some read errors may not be correctable.

At block 630, a decision is made as to whether to retire a portion of a memory device based at least in part on whether reading from such a portion of memory results in too many errors. If such a number of errors is at or below an error threshold, then read process 600 may proceed to block 640 where, for example, read data may be provided to an application that requested the read data. On the other hand, if such a number of errors is above an error threshold, then read process 600 may proceed to block 650, where, for example, a process may begin to retire a portion of memory that leads to too many errors. In a particular implementation, data initially stored in such an error-prone memory portion may be moved to another memory portion that is known to be functional and/or healthy. Such a new memory portion may comprise a portion of spare memory, such as spare memory 120 shown in FIG. 1, for example. At block 660, a memory address, or multiple memory addresses, to identify the original memory location(s) of the data may be remapped to identify the new memory portion to where data is relocated. In one implementation, remapping may comprise assigning a new address to correspond, via a vector for example, to an original address so that a call to the original address may be redirected to a new address specifying the location of relocated data. At block 670, information regarding such remapped addresses may then be provided to a CAM to update remap information stored in the CAM, wherein such information may be stored as a vector remap table, described in detail below. At block 680, in response to one or more remapped addresses being provided to the CAM, updated information may also be provided to a nonvolatile, discretely-addressable memory such as a PCM. For example, a memory controller may provide digital signals representative of remap information regarding a memory device to a CAM, wherein such a memory controller may copy at least a portion of the remap information stored in the CAM into a nonvolatile, discretely-addressable memory if the remap information stored in the CAM is updated. In one implementation, such updated information may be provided to a nonvolatile, discretely-addressable memory on-the-fly, for example, during run-time processes such as read/write processes initiated by a processor. In another implementation, an initialization process may be performed by a system to include scanning for error-prone portions of a memory device.

In one particular implementation, a PCM or other nonvolatile, discretely-addressable memory may be periodically updated with remap information and/or other contents stored in a CAM, as discussed in further detail below. After remapping an error-prone portion of memory, read process 600 may proceed to block 640, wherein read data may be provided to an application that requested the read data, for example. Of course, details of such a memory read process are merely examples, and claimed subject matter is not so limited.

FIG. 7 is a schematic view of a vector remap table 700, according to an embodiment. Information included in table 700, in other implementations, need not be formatted in a table; such information, for example, may comprise an array or other means for organizing such information. Such information, and organization regarding same, may be stored as digital signals representing such information in a nonvolatile, discretely-addressable memory such as a PCM, for example. Column 710 may comprise a list of original addresses 740, such as addr1, addr2, addr3, and so on; status column 720 may comprise information regarding whether a corresponding original address listed in column 710 has been remapped; and column 730 may comprise a list of remapped addresses 750, such as addr1', addr2', addr3', and so on, corresponding to original addresses 740, listed in column 710.

In one implementation, original addresses 740 may comprise one or more addresses included in a read/write request by an application and/or system inquiring about information stored in memory device 100 at the location of the one or more addresses. Status column 720 may comprise metadata to describe whether an original address 740 has been remapped. If such remapping has occurred, then column 730 may comprise a remapped address 750 corresponding to an original address 740. To illustrate by an example according to FIG. 1, addr1, addr5, addr7, and addr8 have been remapped to addr1', addr5', addr7', and addr8', respectively, while addr2, addr3, addr4, and addr6 have not been remapped. Here, original addresses that have not been remapped have no corresponding remapped address in column 730. In another implementation, status column 720 need not be included in table 700 since a presence of a remapped address 750 may be sufficient to indicate that remapping has occurred for a particular original address 740, for example. Of course, details of such a vector remap table and other formats of storing remap information are merely examples, and claimed subject matter is not so limited.

Figure 8:
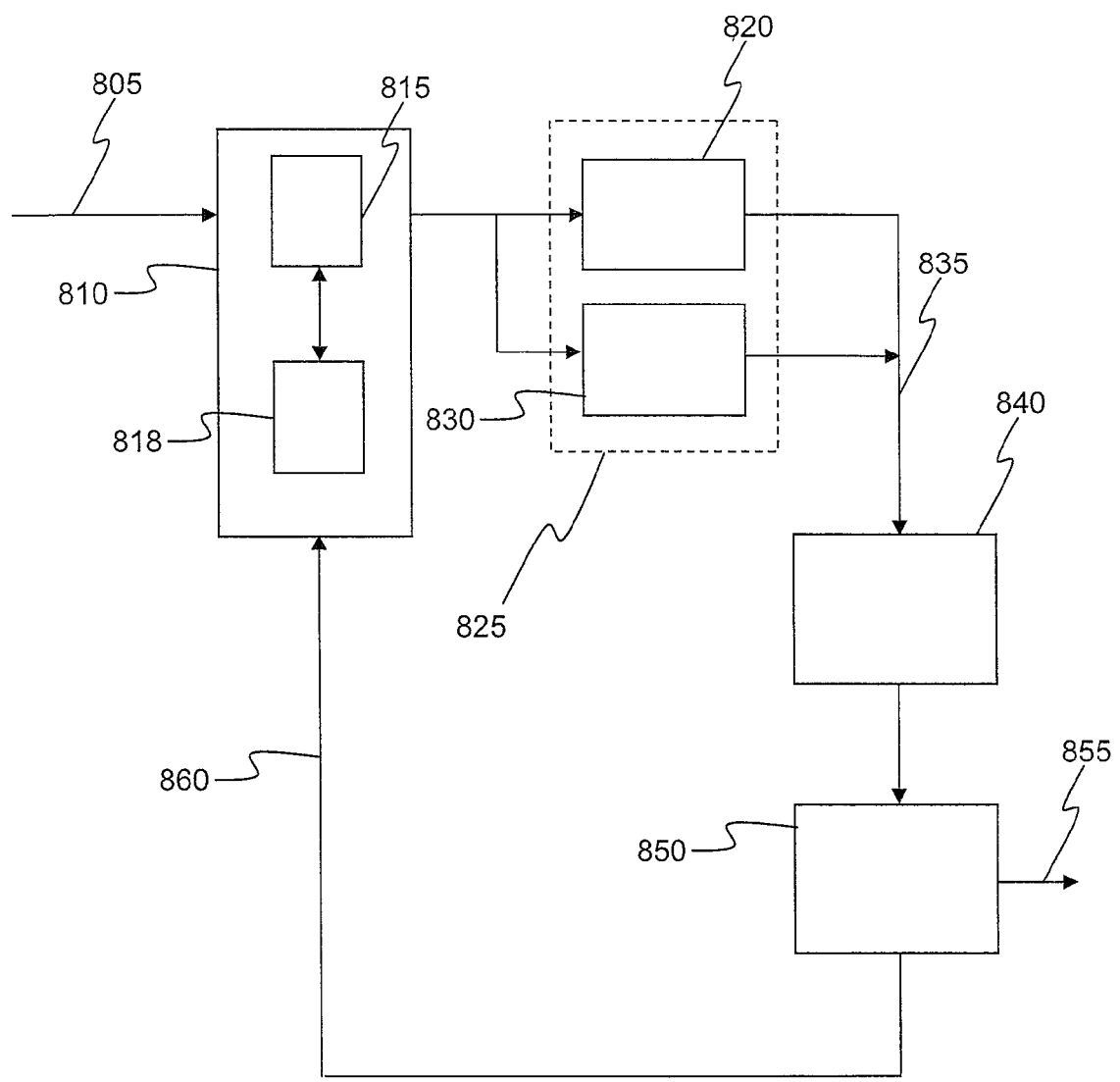
FIG. 8 is a schematic block diagram of a memory system, according to an embodiment.

FIG. 8 is a block diagram of a memory system 800, according to an embodiment. A controller 810 may be configured to receive one or more signals indicative of a read request 805 that comprises an address specifying a location of a memory device 825 from which to read data. Memory device 825 may comprise main memory 820 and spare memory 830, as described above, for example. Incoming addresses accompanying read requests may be passed through a CAM 815, where such addresses may be compared to contents stored in CAM 815, which may comprise remapped addresses associated with original addresses. In one particular implementation, remapping processes occur without particular instructions and/or signals generated by a user at a system level, so that incoming addresses accompanying read requests may always comprise original addresses; such addresses may be associated with their associated remapped addresses subsequent only to a CAM search. In other words, CAM 815 may provide a translation from an original address space to a remapped address space. In such a fashion, controller 810 may determine whether read request 805 comprises an address that has been remapped. Depending on such a determination, controller 810 may direct read request 805 to either main memory 820 or spare memory 830 to read data. For example, if the address of read request 805 has not been remapped, then controller 810 may forward the read request to main memory 820, whereas if such an address has been remapped, then controller 810 may modify read request 805 to comprise a remapped address that may be directed to spare memory 830. Subsequently, either main memory 820 or spare memory 830 may provide read data 835 to an error detection block 840, which may comprise an error counter and/or an ECC decoder, for example. In one embodiment, error detection block 840 comprising an ECC decoder may be disposed in a die element of memory device 825. In another embodiment, error detection block 840 comprising an ECC decoder may be provided at a system level, such as in an application, for example. Error detection block 840 may detect and/or correct any errors present in read data 835, and may express such detected errors as a BER and/or number of bit errors. Accordingly, error detection block 840 may provide corrected read data 845 to an entity that introduced read request 805, such as an application and/or host system. Error detection block 840 may also provide information regarding the number of errors present in read data 835 to a compare engine 850. In the case where error detection block 840 comprises an ECC decoder disposed in a die element of memory device 825, such error information may be accessible by a compare engine application at a system level. In one implementation, for example, an ECC decoder may include an error information register available for access by compare engine 850, which may compare the number of detected errors to an error threshold.

As explained above, such an error threshold may comprise a limit on an acceptable BER or number of errors. Compare engine 850 may provide results 860 of such a comparison to controller 810. Based at least in part on such comparison results, controller 810 may determine whether to retire a particular portion of memory device 825. If such a comparison indicates that a particular portion of memory device 825 resulted in an excess number of bit errors during a read process, for example, then controller 810 may initiate a process to retire the error-prone portion of memory. Such a retiring process may include relocating data stored in the retiring portion of memory to another portion of memory. For example, digital signals representative of data may be moved from a particular portion of main memory 820 to be stored in spare memory 830. Accordingly, controller 810 may modify an address that identified the retiring portion of memory to an address that identifies the new portion of memory to contain the relocated data. Such a modified, remapped address may then be written into CAM 815, where it may be associated with the original address, as described above. Such a memory retiring process may occur seamlessly with respect to an application and/or host system that introduced read request 805, for example. In one implementation, a nonvolatile, discretely-addressable memory 818, such as a PCM for example, may be utilized to back up remap information stored in CAM 815. For example, nonvolatile, discretely-addressable memory 818 may be updated from time to time, occasionally, periodically, and/or every time that CAM 815 is updated with new remap information. In one embodiment, nonvolatile, discretely-addressable memory 818 may be updated on-the-fly, for example, during run-time processes such as a read process initiated by read request 805. In the case where such an update of nonvolatile, discretely-addressable memory 818 occurs for substantially every update of CAM 815, both the nonvolatile, discretely-addressable memory and the CAM may be substantially synchronous with one another. That is, each such memory may contain substantially similar remap information. Such synchronicity may be useful during a disruption of power supplied to memory system 800, wherein a volatile CAM 815 may lose remap information while nonvolatile, discretely-addressable memory 818 may retain such information. Of course, such an implementation of a memory system is merely an example, and claimed subject matter is not so limited.

Figure 9:
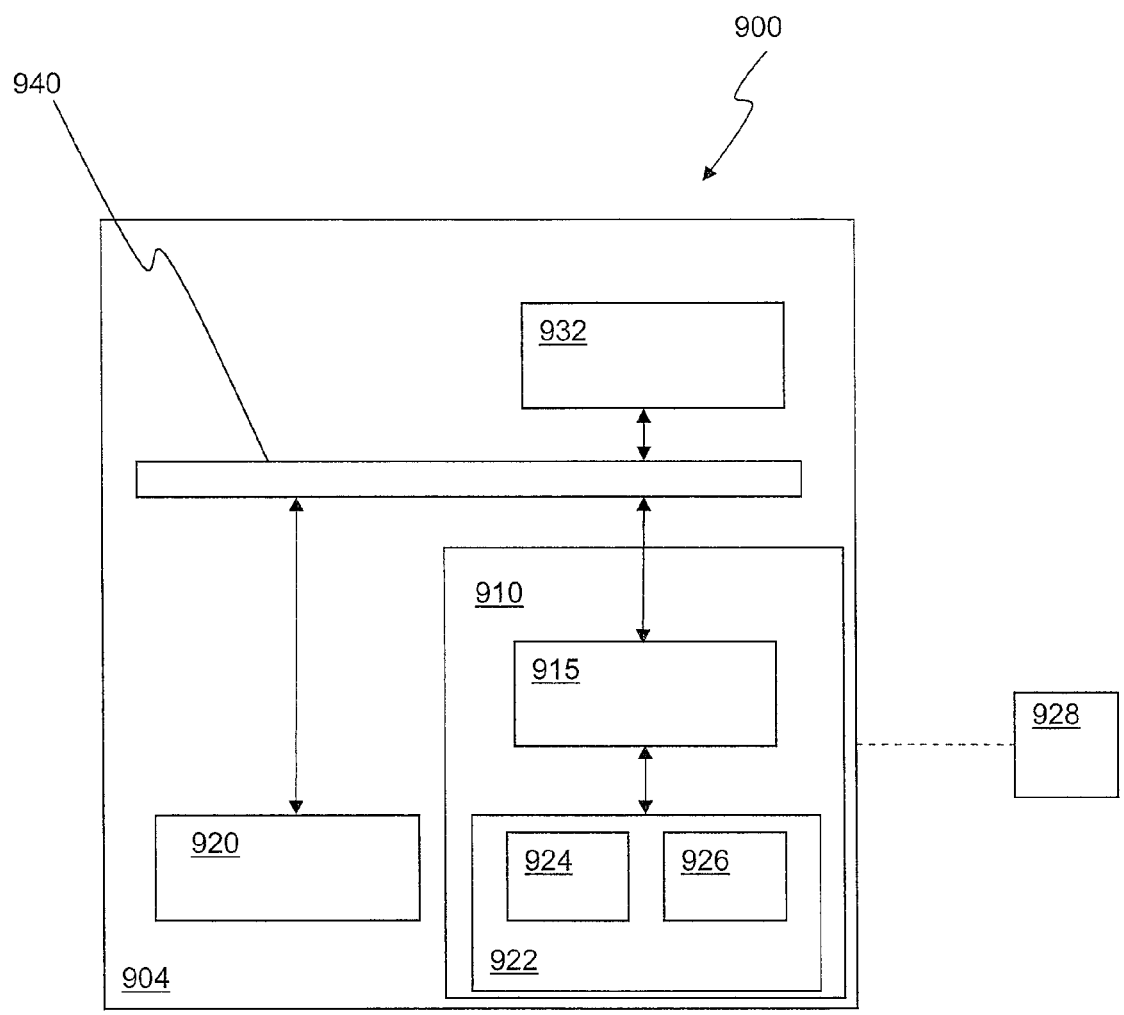
FIG. 9 is a schematic block diagram of a computing system and a memory device, according to an embodiment.

FIG. 9 is a schematic diagram illustrating an exemplary embodiment of a computing system 900 including a memory device 910, which may be partitioned into main and spare portions as discussed above, for example. A computing device 904 may be representative of any device, appliance and/or machine that may be configurable to manage memory device 910. Memory device 910 may include a memory controller 915 and a memory 922. By way of example but not limitation, computing device 904 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 900, and the processes and methods as further described herein, may be implemented using or otherwise including hardware, firmware, software, or any combination thereof. Thus, by way of example but not limitation, computing device 904 may include at least one processing unit 920 that is operatively coupled to memory 922 through a bus 940 and a host or memory controller 915. Processing unit 920 is representative of one or more circuits configurable to perform at least a portion of a data computing procedure or process. By way of example but not limitation, processing unit 920 may include one or more processors, controllers, microprocessors, microcontrollers, application specific integrated circuits, digital signal processors, programmable logic devices, field programmable gate arrays, and the like, or any combination thereof. Processing unit 920 may communicate with memory controller 915 to process memory-related operations, such as read, write, and/or erase, as well as memory partition processes discussed above, for example. Processing unit 920 may include an operating system configured to communicate with memory controller 915. Such an operating system may, for example, generate commands to be sent to memory controller 915 over bus 940. Such commands may include instructions to partition at least a portion of memory 922, to associate one or more attributes to particular partitions, and to program a particular partition based at least in part on the type of data to be programmed and stored, for example.

Memory 922 is representative of any data storage mechanism. Memory 922 may include, for example, a primary memory 924 and/or a secondary memory 926. In a particular embodiment, memory 922 may comprise memory that may be partitioned based at least in part on one or more attributes of the memory and/or a memory management process, as described above. Primary memory 924 may include, for example, a random access memory, read only memory, etc. While illustrated in this example as being separate from processing unit 920, it should be understood that all or part of primary memory 924 may be provided within or otherwise co-located/coupled with processing unit 920.

Secondary memory 926 may include, for example, the same or similar type of memory as primary memory and/or one or more data storage devices or systems, such as, for example, a disk drive, an optical disc drive, a tape drive, a solid state memory drive, etc. In certain implementations, secondary memory 926 may be operatively receptive of, or otherwise configurable to couple to, a computer-readable medium 928. Computer-readable medium 928 may include, for example, any medium that can carry and/or make accessible data, code and/or instructions for one or more of the devices in system 900.

Computing device 904 may include, for example, an input/output 932. Input/output 932 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 932 may include an operatively configured display, speaker, keyboard, mouse, trackball, touch screen, data port, etc.

In the above detailed description, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Some portions of the detailed description above are presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular operations pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a specific apparatus, such as a special purpose computer or a similar special purpose electronic computing device. In one example, such a special purpose computer or special purpose electronic computing device may comprise a general purpose computer programmed with instructions to perform one or more specific functions. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

The terms, "and," "and/or," and "or" as used herein may include a variety of meanings that will depend at least in part upon the context in which it is used. Typically, "and/or" as well as "or" if used to associate a list, such as A, B or C, is intended to mean A, B, and C, here used in the inclusive sense, as well as A, B or C, here used in the exclusive sense. Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments. Embodiments described herein may include machines, devices, engines, or apparatuses that operate using digital signals. Such signals may comprise electronic signals, optical signals, electromagnetic signals, or any form of energy that provides information between locations.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A memory device comprising:
   a port to receive digital signals representative of remap information regarding a memory device;
   a content-addressable memory (CAM) to store said digital signals representative of remap information, wherein said CAM comprises a nonvolatile, discretely-addressable memory comprising memory cells that are individually addressable for a read/write process; and
   a controller to control a back-up nonvolatile, discretely-addressable memory to store at least a portion of said remap information stored in said CAM in response to said remap information stored in said CAM being updated.

2. The memory device of claim 1, further comprising:
   an error correction coding (ECC) decoder to receive digital signals representative of data read from said memory device and to determine a bit error rate and/or a number of bit errors associated with said read signals representative of said data, wherein said controller is adapted to store said remap information based at least in part on whether said bit error rate and/or said number of bit errors meets or exceeds an error threshold.

3. The memory device of claim 1, wherein said CAM comprises a phase-change memory (PCM).

4. The memory device of claim 1, wherein said remap information comprises one or more tables of remap addresses.

5. The memory device of claim 1, wherein said controller is configured to control the back-up nonvolatile, discretely-addressable memory to store the at least a portion of said remap information on-the-fly, during a read/write process directed to said memory device.

6. The memory device of claim 1, wherein said CAM and said back-up nonvolatile, discretely-addressable memory are substantially synchronous with one another.

7. The memory device of claim 1, wherein said back-up nonvolatile, discretely-addressable memory comprises a second CAM.

8. The memory device of claim 1, wherein said storing at least a portion of said remap information stored in said CAM into said back-up nonvolatile, discretely-addressable memory is performed synchronously.

9. A method comprising:
   determining a bit error rate and/or a number of bit errors associated with digital signals representative of data read from a memory device;
   storing digital signals representative of remap information regarding said memory device in a content-addressable memory (CAM) comprising a nonvolatile, discretely-addressable memory comprising memory cells that are individually addressable for a read/write process, wherein said remap information is based at least in part on whether said bit error rate and/or said number of bit errors meets or exceeds an error threshold; and
   storing at least a portion of said remap information stored in said CAM into a back-up nonvolatile, discretely-addressable memory in response to said remap information stored in said CAM being updated.

10. The method of claim 9, wherein said CAM comprising said nonvolatile, discretely-addressable memory comprises a phase-change memory (PCM).

11. The method of claim 9, wherein said remap information comprises one or more tables of remap addresses.

12. The method of claim 11, wherein said memory device comprises a main memory portion and a spare memory portion, and wherein said remap addresses correspond to a memory location in said spare memory portion.

13. The method of claim 9, wherein said storing at least a portion of said remap information stored in said CAM is performed on-the-fly, during a read/write process directed to said memory device.

14. The method of claim 9, wherein said storing further comprises writing said remap information into a portion of said CAM, said portion being substantially the same size as said remap information.

15. A system comprising:
   a host to read/write from/to a memory device and to execute one or more applications;
   an error correction coding (ECC) decoder to receive digital signals representative of data read from said memory device and to determine a bit error rate and/or a number of bit errors associated with said read signals representative of said data; and
   a remap controller to store digital signals representative of a remapped address of said memory device to a content-addressable memory (CAM) based at least in part on whether said bit error rate and/or said number of bit errors meets or exceeds an error threshold, wherein said CAM comprises a nonvolatile, discretely-addressable phase-change memory (PCM) comprising PCM cells that are individually addressable for a read/write process, wherein said remap controller is adapted to control a back-up nonvolatile, discretely-addressable PCM to store at least a portion of said remapped address stored in said CAM in response to said remapped address stored in said CAM being updated.

16. The system of claim 15, wherein said CAM is adapted to receive digital signals representative of a read address and to transmit digital signals representative of a signal responsive, at least in part, to whether said read address corresponds to said remapped address stored in said CAM.

17. The system of claim 16, further comprising:
a selection portion to select either said read address or said remapped address to be used as an address to read from said memory device, wherein said selection is based, at least in part, on said signal.

18. The system of claim 15, wherein said memory device comprises a main memory portion and a spare memory portion, and wherein said remapped address corresponds to a memory location in said spare memory portion.

19. The system of claim 18, wherein said memory device further comprises said ECC decoder and a phase-change memory portion.

20. The system of claim 15, wherein said bit error rate and/or said number of bit errors is responsive, at least in part, to a physical degradation of said memory.

21. The system of claim 15, wherein said remap controller is configured to control the back-up nonvolatile, discretely-addressable PCM to store the at least a portion of said remapped address on-the-fly, during a read/write process directed to said memory device.

* * * * *